US010927450B2

(12) United States Patent
Mebarki et al.

(10) Patent No.: US 10,927,450 B2
(45) Date of Patent: Feb. 23, 2021

(54) METHODS AND APPARATUS FOR PATTERNING SUBSTRATES USING ASYMMETRIC PHYSICAL VAPOR DEPOSITION

(71) Applicant: APPLIED MATERIALS, INC., Santa Clara, CA (US)

(72) Inventors: Bencherki Mebarki, Santa Clara, CA (US); Wenhui Wang, San Jose, CA (US); Huixiong Dai, San Jose, CA (US); Christopher Ngai, Burlingame, CA (US); Joung Joo Lee, San Jose, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 224 days.

(21) Appl. No.: 16/225,443

(22) Filed: Dec. 19, 2018

(65) Prior Publication Data

US 2020/0199741 A1    Jun. 25, 2020

(51) Int. Cl.
*C23C 14/54* (2006.01)
*H01L 21/3213* (2006.01)
(Continued)

(52) U.S. Cl.
CPC .......... *C23C 14/54* (2013.01); *C23C 14/3407* (2013.01); *C23C 14/505* (2013.01); *H01L 21/32132* (2013.01)

(58) Field of Classification Search
None
See application file for complete search history.

(56) References Cited

U.S. PATENT DOCUMENTS 4,525,919 A * 7/1985 Fabian .............. H01L 21/28587
148/DIG. 143
4,618,510 A * 10/1986 Tan ................... H01L 21/28587
257/E21.452
(Continued)

FOREIGN PATENT DOCUMENTS

CN      102184961 A      9/2011
JP      H10223566 A      8/1998
(Continued)

OTHER PUBLICATIONS

International Search Report and Written Opinion for PCT/US2019/066742 dated Apr. 22, 2020.

*Primary Examiner* — Allan W. Olsen
(74) *Attorney, Agent, or Firm* — Moser Taboada

(57) ABSTRACT

Methods and apparatus for processing a substrate are provided herein. In some embodiments, a method for processing a substrate includes: directing a stream of material from a PVD source toward a surface of a substrate at a first non-perpendicular angle to the plane of the surface to deposit the material on one or more features on the substrate and form a first overhang; etching the layer of the substrate beneath the features selective to the deposited material to form a first part of a pattern; removing the material from the features; directing the stream of material from the PVD source toward the surface of the substrate at a second non-perpendicular angle to the plane of the surface to deposit the material on the features on the substrate and form a second overhang; and etching the layer of the substrate beneath the features selective to the deposited material to form a second part of the pattern.

18 Claims, 5 Drawing Sheets

(51) Int. Cl.
*C23C 14/34* (2006.01)
*C23C 14/50* (2006.01)

(56) References Cited

U.S. PATENT DOCUMENTS

| | | | | |
|---|---|---|---|---|
| 4,645,562 | A | * | 2/1987 | Liao .................. H01L 21/31144 438/640 |
| 4,687,730 | A | * | 8/1987 | Eron ........................ G03F 7/40 430/313 |
| 4,771,017 | A | * | 9/1988 | Tobin ........................ G03F 1/22 148/DIG. 100 |
| 5,112,763 | A | * | 5/1992 | Taylor ............... H01L 29/66863 148/DIG. 100 |
| 5,126,288 | A | * | 6/1992 | Nakagawa ........ H01L 21/31144 257/E21.257 |
| 5,190,892 | A | * | 3/1993 | Sano ....................... H01L 21/28 148/DIG. 100 |
| 5,364,664 | A | | 11/1994 | Tsubouchi et al. |
| 5,393,699 | A | | 2/1995 | Mikoshiba et al. |
| 5,395,739 | A | * | 3/1995 | Nakatani ............... G03F 7/2002 257/E21.027 |
| 5,486,449 | A | * | 1/1996 | Hosono ................. G03F 7/2022 430/313 |
| 5,504,347 | A | * | 4/1996 | Jovanovic ............. B82Y 10/00 257/24 |
| 5,529,952 | A | * | 6/1996 | Smith .................... B82Y 10/00 117/88 |
| 5,858,471 | A | | 1/1999 | Ray et al. |
| 5,885,425 | A | * | 3/1999 | Hsieh .................. C23C 14/046 204/192.12 |
| 6,063,707 | A | | 5/2000 | Atwater et al. |
| 6,100,200 | A | | 8/2000 | Van Buskirk et al. |
| 7,022,209 | B2 | | 4/2006 | Sabisch et al. |
| 2009/0146244 | A1 | * | 6/2009 | Tischler .............. H01L 27/0617 257/506 |
| 2009/0217224 | A1 | | 8/2009 | Wiaux et al. |
| 2011/0091812 | A1 | | 4/2011 | Hatakeyama et al. |
| 2012/0032336 | A1 | | 2/2012 | Lin |
| 2012/0110521 | A1 | | 3/2012 | Agarwal et al. |
| 2012/0190204 | A1 | * | 7/2012 | Graves-Abe ...... H01L 21/76898 438/702 |
| 2012/0234792 | A1 | * | 9/2012 | Shin ...................... G03F 7/0035 216/41 |
| 2014/0227875 | A1 | * | 8/2014 | Hacker ............. H01L 21/31116 438/675 |
| 2014/0252630 | A1 | | 9/2014 | Chang et al. |
| 2016/0064026 | A1 | * | 3/2016 | Arora .................... G11B 5/855 204/192.34 |
| 2016/0247687 | A1 | * | 8/2016 | Horiguchi ......... H01L 21/31144 |
| 2016/0268162 | A1 | | 9/2016 | Akasaka et al. |
| 2017/0178877 | A1 | | 6/2017 | Wang et al. |
| 2018/0076035 | A1 | * | 3/2018 | Bergendahl ......... H01L 21/0337 |
| 2019/0146336 | A1 | * | 5/2019 | Chen ................. G03F 7/70691 216/13 |
| 2020/0135464 | A1 | * | 4/2020 | Kesapragada ........ C23C 14/225 |

FOREIGN PATENT DOCUMENTS

| | | |
|---|---|---|
| KR | 10-2010-0025363 A | 3/2010 |
| WO | WO-2002091461 A2 | 11/2002 |

* cited by examiner

METHODS AND APPARATUS FOR PATTERNING SUBSTRATES USING ASYMMETRIC PHYSICAL VAPOR DEPOSITION

FIELD

Embodiments of the present disclosure generally relate to substrate processing equipment and techniques, and more particularly, to methods and apparatus for performing physical vapor deposition (PVD).

BACKGROUND

The semiconductor processing industry generally continues to strive for increased uniformity of layers deposited on substrates. For example, with shrinking circuit sizes leading to higher integration of circuits per unit area of the substrate, increased uniformity is generally seen as desired, or required in some applications, to maintain satisfactory yields and reduce the cost of fabrication. Various technologies have been developed to deposit layers on substrates in a cost-effective and uniform manner, such as chemical vapor deposition (CVD) or physical vapor deposition (PVD).

However, the inventors have observed that with the drive to produce equipment to deposit more uniformly, certain applications may not be adequately served where purposeful deposition is required that is not symmetric or uniform with respect to the given structures being fabricated on a substrate. For example, the inventors have observed that asymmetric or non-uniform deposition of target material during a PVD process can advantageously be used to create one or more patterns on the underlying substrate.

SUMMARY

Methods and apparatus for processing a substrate are provided herein. In some embodiments, a method for processing a substrate includes: directing a stream of material from a PVD source toward a surface of a substrate at a first non-perpendicular angle to the plane of the surface to selectively deposit the material on a top portion of one or more features on the substrate and form a first overhang extending beyond a first sidewall of the one or more features; etching for a first time a layer of the substrate disposed beneath the one or more features selective to the deposited material to form a first part of a pattern on the layer; removing the deposited material from the one or more features; directing the stream of material from the PVD source toward the surface of the substrate at a second non-perpendicular angle to the plane of the surface to selectively deposit the material on the top portion of the one or more features on the substrate and form a second overhang extending beyond a second sidewall, opposite the first sidewall of the one or more features; and etching for a second time the layer of the substrate beneath the one or more features selective to the deposited material to form a second part of the pattern on the layer.

In accordance with an aspect of the disclosure, there is provided a method for processing a substrate. The method includes: a directing a stream of material from a PVD source toward a surface of a substrate at a first non-perpendicular angle to the plane of the surface to selectively deposit the material on a top portion of one or more features on the substrate and form a first overhang extending beyond a first sidewall of the one or more features, the substrate comprising a first layer, a second layer disposed atop the first layer, and a third layer including the one or more features disposed atop the second layer; etching for a first time the second layer of the substrate disposed beneath the one or more features selective to the deposited material to form a first part of a pattern on the second layer; removing the deposited material from the one or more features; directing the stream of material from the PVD source toward the surface of the substrate at a second non-perpendicular angle to the plane of the surface to selectively deposit the material on the top portion of the one or more features on the substrate and form a second overhang extending beyond a second sidewall, opposite the first sidewall of the one or more features; and etching for a second time the second layer of the substrate beneath the one or more features selective to the deposited material to form a second part of the pattern on the second layer.

In accordance with an aspect of the disclosure, there is provided a nontransitory computer readable storage medium having stored thereon a plurality of instructions that when executed cause a process controller to perform a method for processing a substrate. The method can include any of the embodiments disclosed herein. In some embodiments, the method includes: directing a stream of material from a PVD source toward a surface of a substrate at a first non-perpendicular angle to the plane of the surface to selectively deposit the material on a top portion of one or more features on the substrate and form a first overhang extending beyond a first sidewall of the one or more features; etching for a first time a layer of the substrate disposed beneath the one or more features selective to the deposited material to form a first part of a pattern on the layer; removing the deposited material from the one or more features; directing the stream of material from the PVD source toward the surface of the substrate at a second non-perpendicular angle to the plane of the surface to selectively deposit the material on the top portion of the one or more features on the substrate and form a second overhang extending beyond a second sidewall, opposite the first sidewall of the one or more features; and etching for a second time the layer of the substrate beneath the one or more features selective to the deposited material to form a second part of the pattern on the layer.

Other and further embodiments of the present invention are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatuses for creating one or more patterns on the underlying substrate are disclosed herein. Embodiments of the disclosed methods and apparatus advantageously enable uniform angular deposition of materials on a substrate. In such applications, deposited materials are asymmetric or angular with respect to a given feature on a substrate, but can be relatively uniform within all features across the substrate. Furthermore, embodiments of the disclosed methods and apparatus advantageously can be used for forming one or more patterns on a layer of a substrate, such as line and space patterns on a layer of the substrate.

Figure 1:
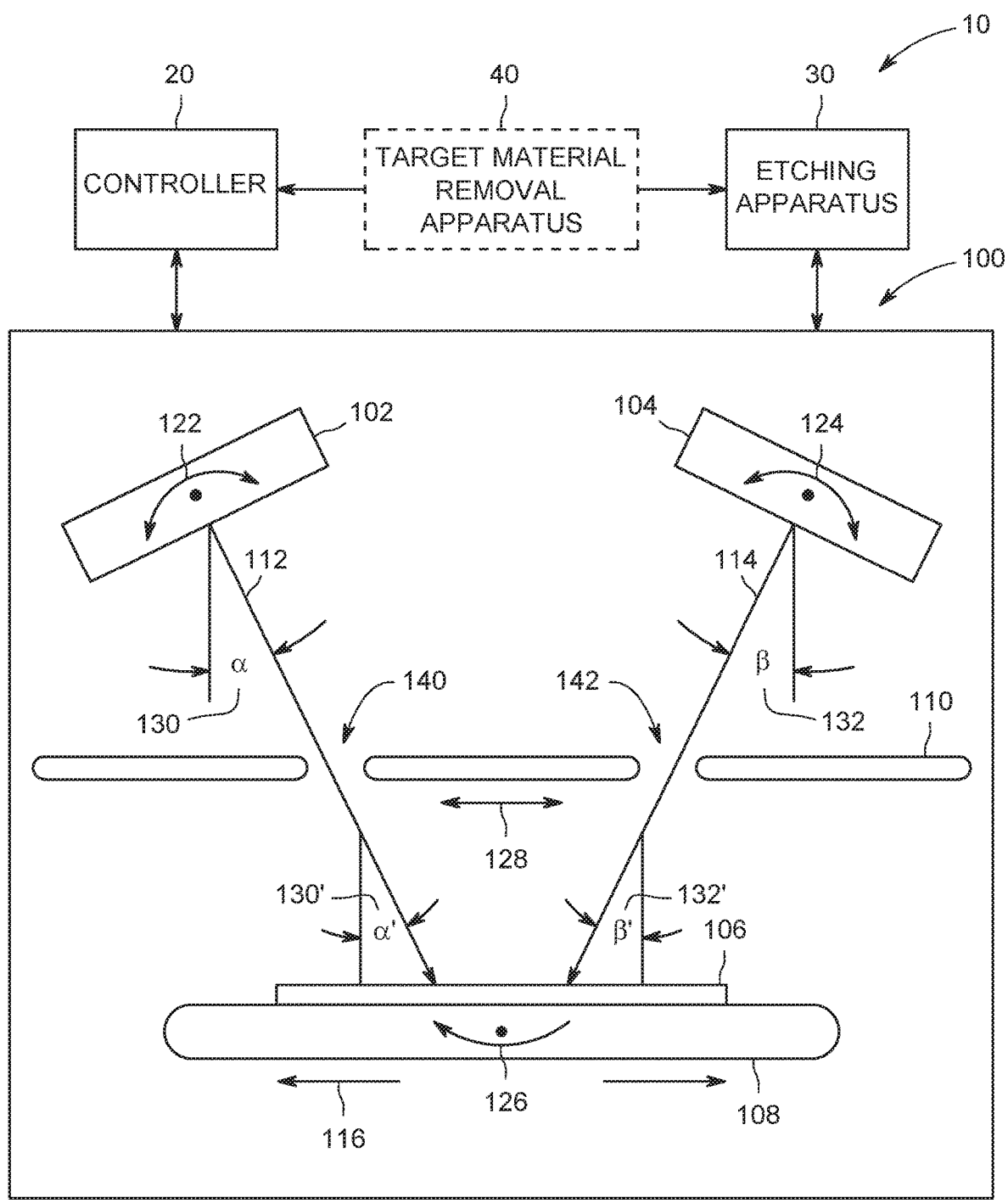
FIG. 1 is a schematic diagram of a system that includes an apparatus used for PVD of material on substrates and an etching apparatus in accordance with at least some embodiments of the disclosure.

FIG. 1 is a schematic side view of a system 10 that includes a physical vapor deposition (PVD) apparatus 100, which can be controlled by a process controller (or processor) 20, and an etching apparatus 30, in accordance with at least some embodiments of the disclosure. In some embodiments, each of the PVD apparatus 100 and the etching apparatus 30 can be controlled by the process controller 20. In some embodiments, the etching apparatus 30 can be controlled by a separate controller.

The PVD apparatus 100 is configured for the deposition of materials on a substrate 106 at a non-perpendicular angle to the generally planar surface of the substrate. The PVD apparatus 100 generally includes a first PVD source 102 and a substrate support 108 for supporting a substrate 106. The PVD apparatus 100 can also include one or more collimators 110.

The first PVD source 102 is configured to provide a first directed stream of material flux (e.g., a first stream 112) from the source toward the substrate support 108 (and any substrate 106 disposed on the substrate support 108). In some embodiments, the PVD apparatus 100 may include a second PVD source 104 configured to provide a second directed stream of material flux (e.g., a second stream 114) from the source toward the substrate support 108 (and any substrate 106 disposed on the substrate support 108). The substrate support has a support surface to support the substrate such that a working surface of the substrate to be deposited on is exposed to the first stream 112 of material flux and, when present, the second stream 114 of material flux. The first and second streams 112, 114 of material flux provided by the first and second PVD sources 102, 104 have a width greater than that of the substrate support 108 (and any substrate 106 disposed on the substrate support 108). The first and second streams 112, 114 of material flux have a linear elongate axis corresponding to the width of the first and second streams 112, 114 of material flux. The substrate support 108 is configured to move linearly with respect to the first and second PVD sources 102, 104, as indicated by arrows 116. Optionally, the substrate support 108 may additionally be configured to rotate about a z-axis of the substrate support 108 (i.e., a central axis perpendicular to the support surface) or tilt about a y-axis of the substrate support 108, as indicated by arrow 126. Deposition of materials at a non-perpendicular angle to the substrate surface can be used to advantageously create an overhang that extends beyond one or more sidewalls of a feature that is disposed on the substrate 106, as will be described in greater detail below.

The first and second PVD sources 102, 104 include target material to be sputter deposited on the substrate. In some embodiments, the target material of the first and second PVD sources 102, 104 are the same target material. Alternatively, in some embodiments, the respective target materials of the first and second PVD sources 102, 104 are different from each other. The target material can be, for example, a metal, such as titanium, or the like, suitable for depositing titanium (Ti) or titanium nitride (TiN) on the substrate. In some embodiments, the target material can be, for example, silicon, or a silicon-containing compound, suitable for depositing silicon (Si), silicon nitride (SiN), silicon oxynitride (SiON), or the like on the substrate. Other suitable materials may be used as well in accordance with the teachings provided herein. The first PVD source 102 further includes, or is coupled to, a power source to provide suitable power for forming a plasma proximate the target material and for sputtering atoms off the target material. The power source can be either or a combination of a DC, Pulsed DC, HiPIM, or an RF power source.

Unlike an ion beam or other ion source, the first and second PVD sources 102, 104 are configured to provide mostly neutrals and few ions of the target material. As such, a plasma may be formed having a sufficiently low density to avoid ionizing too many of the sputtered atoms of target material. For example, for a 300 mm diameter wafer as the substrate, about 1 to about 20 kW of DC or RF power may be provided. The power or power density applied can be scaled for other size substrates. In addition, other parameters may be controlled to assist in providing mostly neutrals in the first and second streams 112, 114 of material flux. For example, the pressure may be controlled to be sufficiently low so that the mean free path is longer than the general dimensions of an opening of the first and second PVD sources 102, 104 through which the stream of material flux passes toward the substrate support 108 (as discussed in more detail below). In some embodiments, the pressure may be controlled to be about 0.1 to about 5 millitorr.

The lateral angles of incidence of the first and second streams of material flux can be controlled. For example, FIG. 1 depicts the PVD apparatus 100 illustrating material deposition angle α 130 of the first stream 112 from the first PVD source 102 and angle β 132 of the second stream 114 from the second PVD source 104 in accordance with the present disclosure. The angles α 130 and β 132 can either be fixed or adjustable by rotating the first PVD source 102 as shown by arrow 122, and/or rotating the second PVD source 104 as shown by arrow 124. In some embodiments, the angles α 130 and β 132 can be measured as an average angle of incidence with respect to the plane of the substrate 106 (e.g., a simple average of maximum and minimum angles of incidence for particles in a given stream of material flux). In some embodiments, the angles α 130 and β 132 can be measured as a primary angle of incidence with respect to the plane of the substrate 106 (e.g., a volume or mass weighted average of various angles of incidence for particles in a given stream of material flux).

In addition to the angles α 130 and β 132, within-plane angles at which the first stream 112 and the second stream 114 are directed toward the substrate 106 surface can also be used to create the overhang on the feature that is disposed on a substrate, as discussed in more detail below.

As discussed above, the apparatus can optionally include the collimator 110. The collimator 110 is a physical structure such as a shroud, disk, a plurality of baffles, or the like, having one or more openings 140, 142. When present, the collimator 110 is interposed between the first and second PVD sources 102, 104 and the substrate 106 such that the first and second streams 112, 114 of material flux travel through the collimator 110 to reach the substrate 106. Any materials with an angle to great to pass through the openings 140, 142 of the collimator 110 will be blocked, thus limiting the permitted angular range of materials reaching the surface of substrate 106. The collimator 110 may include a single opening. Alternatively/additionally the PVD apparatus 100 may include a single collimator 110 having multiple openings. The collimator can function as a spread angle control apparatus that controls the angle of the spread of materials being sputtered from the first and/or second PVD sources. The one or more collimators 110 can move linearly as shown by arrow 128.

The angle of incidence 130', 132' at which the first and second streams 112, 114 of material actually contact the substrate surface may be different than the angle of incidence 130, 132 at which the streams of material are provide by the first PVD source 102 and the second PVD source 104. The angle of incidence 130', 132' at which the first and second streams 112, 114 of material actually contact the substrate surface can be controlled/altered by one or more of the following: the angle of incidence 130, 132 at which the streams of material are provided by the first PVD source 102 and the second PVD source 104, the number and placement of openings in collimator 110, the linear position of collimator 110, and the rotation (e.g. arrow 126) of the substrate support 108 about the x-axis, y-axis, and/or z-axis.

The process controller 20 controls the overall operation of the PVD chamber 11. More particularly, the process controller 20 controls at least one or more of the first PVD source 102, the second PVD source 104 (when present), the substrate support 108, or the collimator 110 (when present). The process controller 20 can control movement of the substrate support 108, movement of the first PVD source 102 and movement of the second PVD source 104 for directing the first and second streams 112, 114 of material flux toward the substrate at one or more of the above-reference angles, and movement of the collimator 110, if used. The process controller 20 can also control a pressure inside the PVD apparatus 100 and an amount of power provided to a target material prior to, during and/or after PVD of the material onto the substrate 106.

The etching apparatus 30 can be configured to perform one or more suitable etching processes. For example, the etching apparatus 30 can be configured to perform a dry etching process and/or a wet etching process. The etching apparatus 30, for example, can be configured to perform a dry plasma etching process suitable for selectively etching materials as described in more detail below.

After an etching process of the substrate 106 is completed, removal of the deposited material may be necessary. Accordingly, one or more suitable target material removal apparatus 40 may be used to remove (e.g., strip away) the deposited material from the substrate 106. For example, the target material removal apparatus 40 can be a plasma etch chamber, which can be a component of the etching apparatus 30, but configured to etch material deposited on the substrate 106 using one or more gases that can be different from the gases used by the etching apparatus 30, or a separate stand-alone apparatus that can, for example, use dry $O_2$ ashing or other suitable techniques to remove/strip the deposited material from the substrate 106.

The methods and embodiments disclosed herein advantageously enable deposition of materials with a shaped profile (e.g., creating an overhang) that may advantageously be used as an etch mask layer to control the shape of an underlying pattern to be etched into one or more layers of the substrate.

Figure 2:
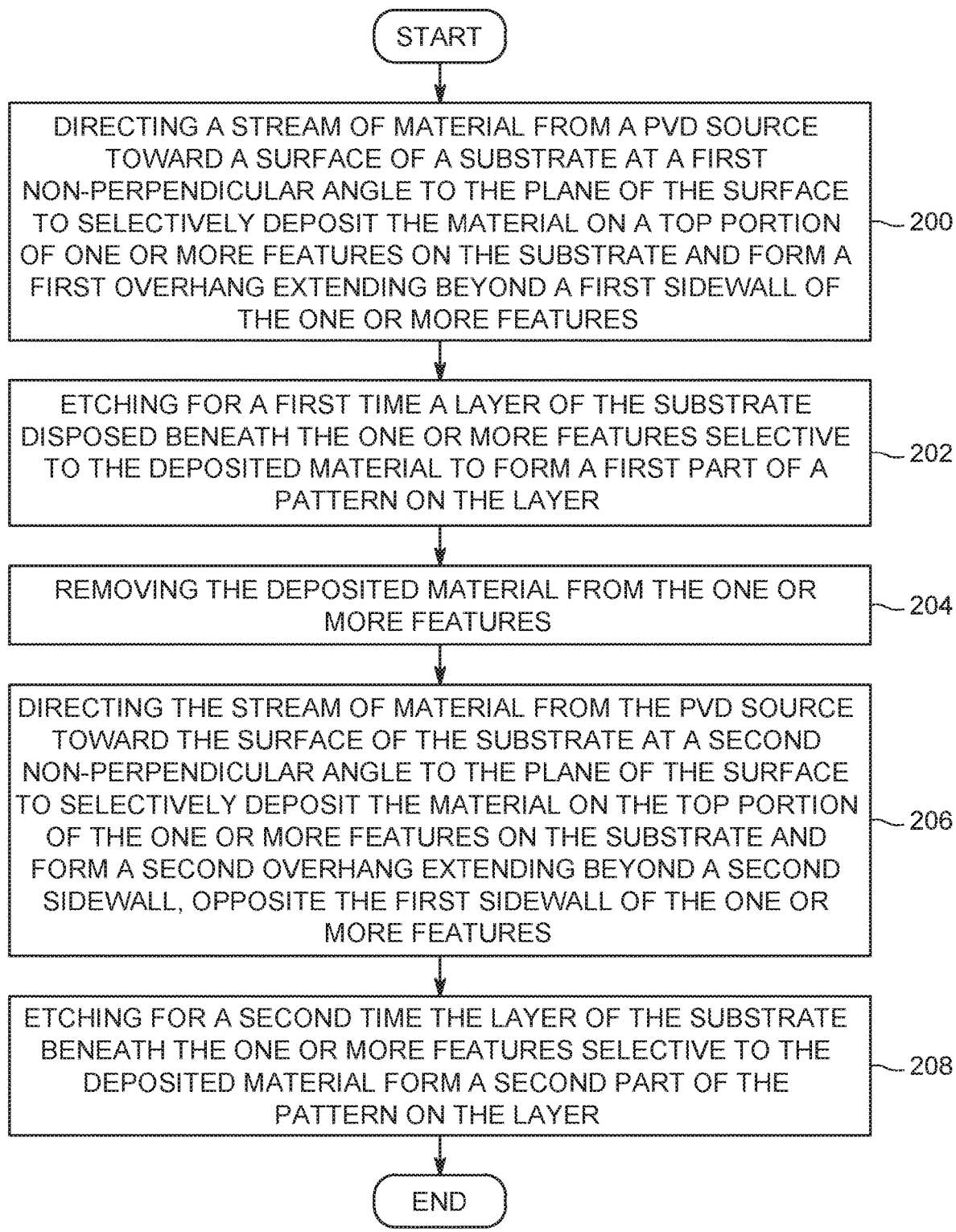
FIG. 2 is a flowchart of a method for patterning a substrate in accordance with at least some embodiments of the disclosure.

For example, FIG. 2 depicts a flowchart of a method for patterning a substrate in accordance with at least some embodiments of the disclosure. The method of FIG. 2 can be used, for example, to form one or more features in or on one or more layers of a substrate. FIGS. 3A-3K illustrate schematic diagrams of the stages of fabrication of a substrate 300 in accordance with at least some embodiments of the disclosure.

Figure 3A:
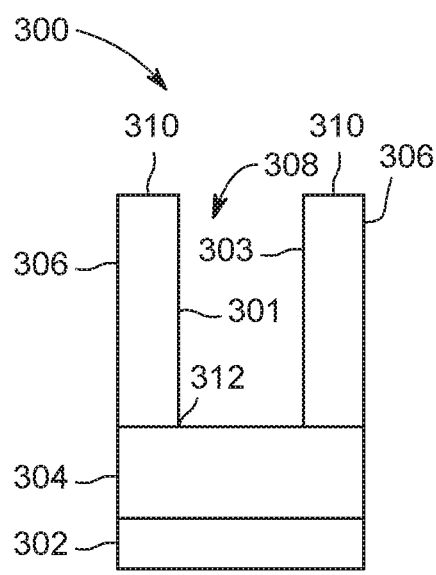
FIGS. 3A-3K illustrate schematic diagrams of stages of fabrication of a substrate undergoing methods in accordance with at least some embodiments of the disclosure.
Figure 3B:
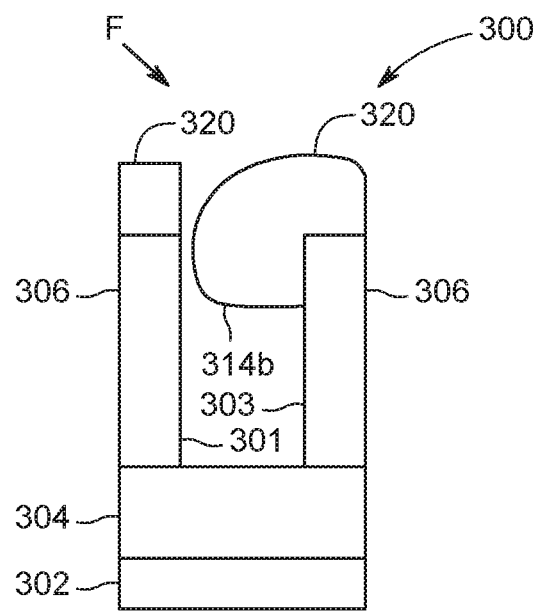
Figure 3C:
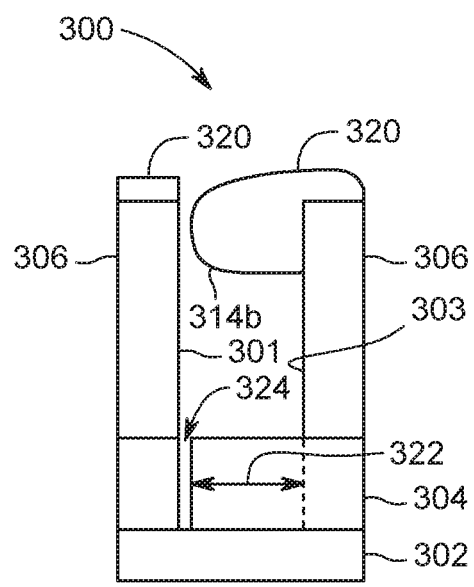

FIG. 3A illustrates the substrate 300 which includes a first layer or target layer 302 (layer 302), e.g., an etch stop layer (ESL), a second layer or transfer layer 304 (layer 304) disposed on the layer 302, and a third layer 306 (layer 306) including at least one feature 308, which can be disposed over or on the layer 304. Examples of material that can used for the layer 302 can include, but is not limited to, aluminum nitride (AlN), aluminum oxynitride (AlON), titanium nitride (TiN), silicon oxycarbide (SiOC), silicon oxynitride (SiON), etc. Examples of material that can used for the layer 304 can include, but is not limited to, silicon nitride (SiN), titanium nitride (TiN), silicon oxide ($SiO_x$), AlN, AlON, AlCN, $HfO_2$ etc. Examples of material that can used for the layer 306 can include, but is not limited to, spin-on carbon (SOC), advanced patterning film (APF), amorphous carbon ($\alpha$-C), photo resistive film (PR), silicon (Si), etc. The features 308 can be a fin, an opening, a trench, a via, or a dual damascene feature, or the like, and can protrude from the substrate 300 rather than extend into the layer 302 of the substrate 300. While the foregoing is directed to embodiments of the present disclosure, other and further embodiments of the disclosure may be devised without departing from the basic scope thereof.

The layer 306 includes a top portion 310, on which a material 320 (FIG. 3B) is deposited, and a bottom portion 312 that extends from the layer 304. The features 308 (e.g., openings, vias, trenches, or the like) extend through the layer 306 and are defined by first and second sidewalls 301, 303 and third and fourth sidewalls (not explicitly shown). In some embodiments, the first and second sidewalls 301, 303 and the third and fourth sidewalls can be parallel and opposite to each other, while the first and second sidewalls 301, 303 and the third and fourth sidewalls can be arranged at a non-zero angle to each other, and in the example shown at 90 degrees (adjacent) to each other.

The method for patterning the substrate 300, begins at 200 where a stream of the material 320 from the first PVD source 102 is directed towards the substrate 300 surface at a non-perpendicular angle, e.g., $\alpha$ 130, $\alpha'$ 130', or other suitable angle (see directional arrow F of FIG. 3B, for example), to the plane of the substrate 300 surface. Alternatively/additionally, the second PVD source 104 or both the first and second PVD sources 102, 104, respectively can be used to deposit the material 320.

The material 320 is deposited on the top portion 310 of the layer 306 to form an overhang 314b that extends beyond, for example, the second sidewall 303 of the feature 308; providing the material 320 on one side of the feature 308 is sometimes referred to as a right nose profile configuration. More particularly, the stream of material 320 is directed from the first PVD source 102, and the angle at which the stream of material 320 is directed allows for asymmetric deposition of the material 320 around the features 308. That is, the overhang 314b only extends beyond the second sidewall 303, but does not extend, or does not substantially extend, beyond the first sidewall 301 or the third and fourth sidewalls (FIG. 3B) because of the angle of the stream of the material 320. Alternatively or in combination, in some embodiments, overhang may be formed on the first sidewall 301 and/or the third and fourth sidewalls by control of the relative orientation of the substrate with respect to the stream of material 320, as described in greater detail below. A small amount of material 320 can be deposited on a relatively small area of the second sidewall 303 adjacent the top portion 310 of the layer 306 and can support the overhang 314b. In some embodiments, the stream of material 320 can also be directed from the first PVD source 102 at angle that provides deposition of the material 320 on the layer 304 of substrate 300.

The collimator 110, which includes an opening, can be used to limit the angular range of the stream of material 320. More particularly, the placement of the collimator 110 (and physical structure of the collimator 110) with respect to the first PVD source 102 can be used to control the angle of incidence 130' that the stream of the material 320 contacts the surface of the substrate 300, and, therefore can be used to control how far the overhang 314b extends beyond the second sidewall 303; however, as noted above, use of the collimator 110 is optional.

The substrate 300 can be scanned (e.g., linearly along arrow 116) through the stream of material 320 via the substrate support 108 to ensure that the material 320 forms an overhang 314b that extends beyond only the second sidewall 303, with minimal or no coverage on the second sidewall.

The amount/distance that the overhang 314b extends beyond the second sidewall 303 can depend on, but is not limited to, the material used for the PVD process, the angle at which the stream of material 320 is provided at, the angle of incidence 130' that is controlled by the collimator 110, how many times the substrate support 108 is scanned, an angle at which the substrate support 108 is rotated, whether or not the second PVD source 104 is used in conjunction with the first PVD source 102, etc.

At 202, the substrate 300 is selectively etched for a first time to form a first part of a pattern on the layer 304, such as, a fin, trench, a via, dual damascene feature, line, groove, etc. in the layer 304 using the etching apparatus 30, which as noted above, can be configured to perform a dry etching process, or other suitable etching process on the substrate 300. For illustrative purposes, a data line 324 (line 324) is shown etched into the layer 304; the line 324 can have a width that is greater than, equal to, or less than 10 nm. More particularly, and with reference to FIG. 3C, the substrate 300 is etched such that layer 304 is etched relative to layer 306, the layer 302, and the overhang 314b based on how far out the overhang 314b extends beyond the second sidewall 303; some of the deposited material 320 may be removed during the etching process performed at 202 (see FIG. 3C, for example). The etch process can be an anisotropic, or directional etch in a substantially orthogonal direction to the substrate 300. That is, the portion(s) 322 of the layer 304 that are covered by the overhang 314b are not etched (or not substantially etched) during the etching process, which results in the layer 304 of the substrate 300 being etched less than the layer 304 would have been etched if the portion 322 of the layer 304 was not covered by the overhang 314b. The etch process thus extends the pattern defined by the plurality of features 308 into the layer 304, while controlling the critical dimension (e.g., the width of the feature) of the feature by control of the overhang 314b, which acts as a masking layer for the etch process. For example, when the features 308 are openings, as in the illustrated embodiment, the openings can be translated into one, two, three, etc. openings (e.g., lines) on the second layer 304, as described in more detail below. The etch process can be performed for a suitable duration until, for example, the layer 302 is reached.

Figure 3D:
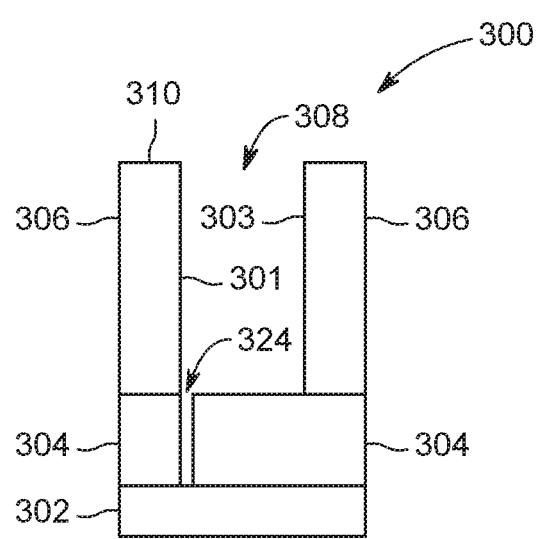
Figure 3E:
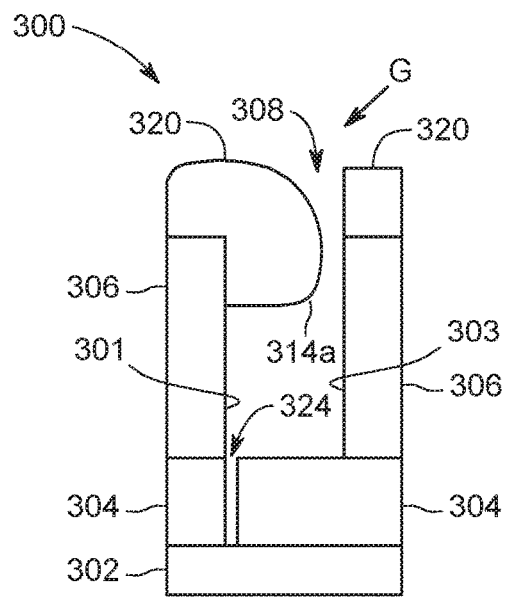
Figure 3F:
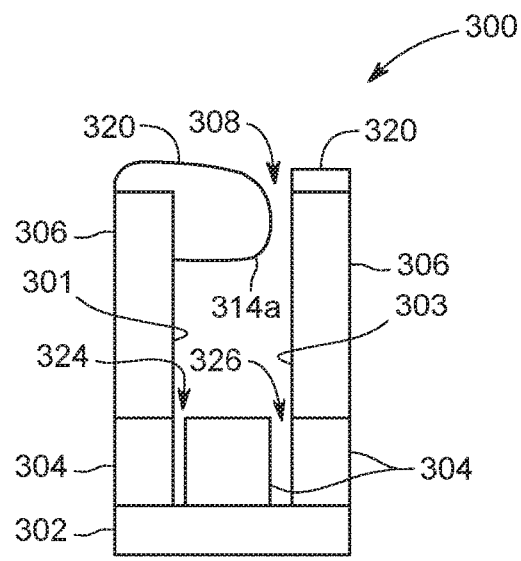

If more lines, e.g., a line disposed adjacent the second sidewall 303, need to be etched into the layer 304, the material 320 can be removed/stripped away from the substrate 300, i.e., the top portion 310, using the target material removal apparatus 40 at 204, as shown in FIG. 3D.

Next, at 206, for example, the substrate 300 can be rotated and the stream of material 320 can be directed towards the substrate 300 surface at a non-perpendicular angle, e.g., α 130, α' 130', or other suitable angle (see directional arrow G of FIG. 3E, for example), to the plane of the substrate 300 surface. Alternatively/additionally, the second PVD source 104 or both the first and second PVD sources 102, 104, respectively can be used to deposit the material 320.

Again, the material 320 is deposited on the top portion 310 of the layer 306 to form an overhang 314a that extends beyond, for example, the first sidewall 301 of the feature 308; providing the material 320 on one side of the feature 308 is sometimes referred to as a left nose profile configuration. More particularly, the stream of material 320 is directed from the first PVD source 102, and the angle at which the stream of material 320 is directed allows for asymmetric deposition of the material 320 around the features 308. That is, the overhang 314a only extends beyond the first sidewall 301, but does not extend, or does not substantially extend, beyond the second sidewall 303 or the third and fourth sidewalls (FIG. 3E, for example) because of the angle of the stream of the material 320.

As noted above, the amount/distance that the overhang 314a extends beyond the first sidewall 301 can depend on, but is not limited to, the material used for the PVD process, the angle at which the stream of material 320 is provided at, the angle of incidence 130' that is controlled by the collimator 110, how many times the substrate support 108 is scanned, an angle at which the substrate support 108 is rotated, whether or not the second PVD source 104 is used in conjunction with the first PVD source 102, etc.

At 208, the layer 304 is etched for a second time to form a second part of the pattern on the layer 304, e.g., another line 326, but since the distance that the overhang 314a extends beyond the first sidewall 301 is less than a distance that the overhang 314b extends beyond the second sidewall 303, the line 326 etched at 208 is wider than the line 324 (FIG. 3F); however, the distance that the overhang 314a extends beyond the first sidewall 301 can be adjusted to form a line 326 that is as thin or thinner than the line 324. For example, the distance that the overhang 314a extends beyond the first sidewall 301 can be greater than a distance that the overhang 314b extends beyond the second sidewall 303, in which case the line 326 would be thinner than the line 324, or the distance that the overhang 314a extends beyond the first sidewall 301 can be equal to a distance that the overhang 314b extends beyond the second sidewall 303, in which case the line 326 would be equally as thin (or thick) as the line 324.

While the above method has been described herein as including the first and second sidewalls 301, 303 with the overhangs 314a, 314b, respectively, to form the lines 324, 326, the disclosure is not so limited.

Figure 3G:
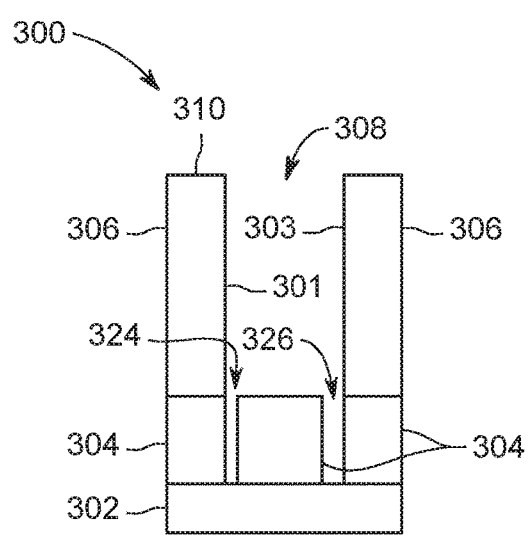
Figure 3H:
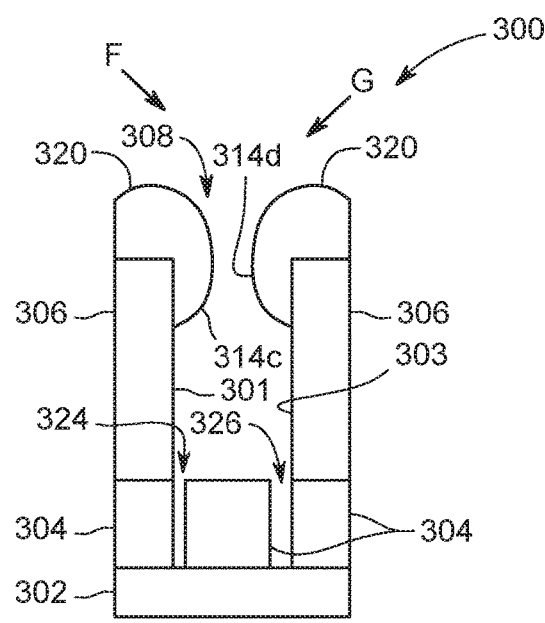

For example, if more lines, e.g., a line disposed in-between the lines 324, 326, need to be etched into the layer 304, the material 320 can be removed/stripped away from the substrate 300, i.e., the top portion 310, using the target material removal apparatus 40, as shown in FIG. 3G, and as shown in FIG. 3H, the material 320 can be deposited on the sidewalls 301, 303 to form respective overhangs 314c, 314d (FIG. 3H).

For example, the overhang 314c can be formed by first depositing the material 320 on the first sidewall 301 and then the overhang 314d can be formed by depositing the material 320 on the second sidewall 303 or vice versa, in a manner as described above. The distance that the overhangs 314c, 314d respectively extend beyond sidewalls 301, 303 can vary depending on a desired thinness (or thickness) of a line that is to be etched in the layer 304, but the overhangs 314c, 314d should at least extend beyond the previously etched lines 324, 326; otherwise, the previously etched lines 324, 326 would be incorporated into the newly etched line.

Figure 3I:
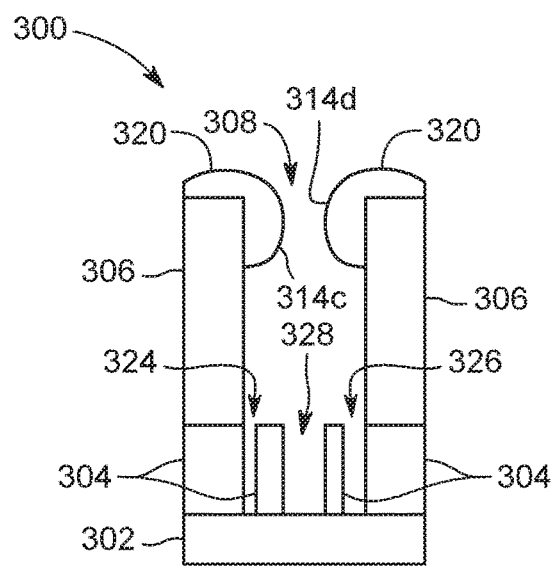
Figure 3J:
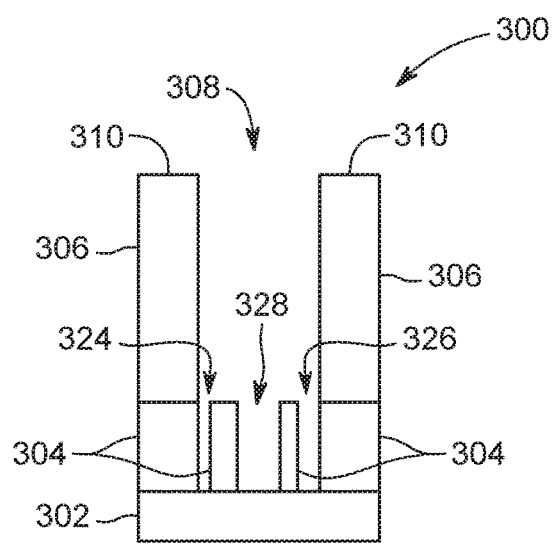
Figure 3K:
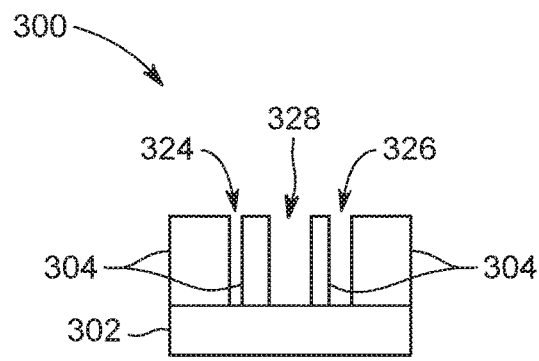

After the overhangs 314, 314d are formed on the sidewalls 301, 303, the substrate 300 is selectively etched for a third time to form a third part of the pattern on the layer 304, e.g., a line 328 FIG. 3I. Next, the material 320 can be removed/stripped away from the substrate 300, i.e., the top portion 310, using the target material removal apparatus 40, as shown in FIG. 3J, and, if desired, the layer 306 can also be removed.

More particularly, after the layer 306 is removed, the three lines 324, 326, and 328 including the remaining portions of the layer 304 will remain atop the layer 302. The lines 324, 326, 328 can be used for pattern transfer into the layer 302 and the remaining portions of the layer 304 can be used for power rails, e.g., for delivering energy to a system.

The methods and apparatus described herein can advantageously be used for creating various patterns on a substrate, in a more efficient manner than conventional methods and apparatuses that are configured to perform similar operations during substrate fabrication. For example, using the methods and apparatus described herein substrates can be formed with patterns including one or more line (or spacing) configurations using a single lithographic process.

While the foregoing is directed to embodiments of the present disclosure, other and further embodiments of the disclosure may be devised without departing from the basic scope thereof.

What is claimed is:

1. A method for processing a substrate, comprising:
   directing a stream of material from a PVD source toward a surface of a substrate at a first non-perpendicular angle to a plane of the surface to selectively deposit the material on a top portion of one or more features on the substrate and form a first overhang extending beyond a first sidewall of the one or more features;
   etching for a first time a layer of the substrate disposed beneath the one or more features selective to the deposited material to form a first part of a pattern on the layer;
   removing the deposited material from the one or more features;
   directing the stream of material from the PVD source toward the surface of the substrate at a second non-perpendicular angle to the plane of the surface to selectively deposit the material on the top portion of the one or more features on the substrate and form a second overhang extending beyond a second sidewall, opposite the first sidewall of the one or more features;
   etching for a second time the layer of the substrate beneath the one or more features selective to the deposited material to form a second part of the pattern on the layer;
   after etching for the second time, removing the deposited material from the one or more features;
   directing the stream of material from the PVD source toward the surface of the substrate at a third non-perpendicular angle to the plane of the surface to selectively deposit the material on the top portion of the one or more features on the substrate and form a third overhang extending beyond the first sidewall;
   directing the stream of material from the PVD source toward the surface of the substrate at a fourth non-perpendicular angle to the plane of the surface to selectively deposit the material on the top portion of the one or more features on the substrate and form a fourth overhang extending beyond the second sidewall;
   etching for a third time the layer of the substrate beneath the one or more features selective to the deposited material to form a third part of the pattern on the layer; and
   removing the one or more features from the substrate.

2. The method of claim 1, wherein the first non-perpendicular angle and the second non-perpendicular angle are different from each other such that a distance that the first overhang extends beyond the first sidewall is at least one of greater than or less than a distance that the second overhang extends beyond the second sidewall.

3. The method of claim 1, wherein the first non-perpendicular angle and the second non-perpendicular angle are the same as each other such that a distance that the first overhang extends beyond the first sidewall is equal to a distance that the second overhang extends beyond the second sidewall.

4. The method of claim 1, wherein directing the stream of material from the PVD source toward the surface of the substrate at the second non-perpendicular angle to the plane of the surface to selectively deposit the material on the top portion of the one or more features on the substrate and form the second overhang extending beyond the second sidewall comprises rotating the substrate and directing the stream of material from the PVD source toward the surface of the substrate at the second non-perpendicular angle to the plane of the surface to selectively deposit the material on the top portion of the one or more features on the substrate and form the second overhang extending beyond the second sidewall.

5. The method of claim 4, wherein the substrate is rotated 180°.

6. The method of claim 1, wherein directing the stream of material from the PVD source toward the surface of the substrate at the fourth non-perpendicular angle to the plane of the surface to selectively deposit the material on the top portion of the one or more features on the substrate and form the fourth overhang extending beyond the second sidewall comprises rotating the substrate and directing the stream of material from the PVD source toward the surface of the substrate at the fourth non-perpendicular angle to the plane of the surface to selectively deposit the material on the top portion of the one or more features on the substrate and form the fourth overhang extending beyond the second sidewall.

7. The method of claim 6, wherein the substrate is rotated 180°.

8. The method of claim 1, wherein the PVD source comprises a second PVD source, and
   wherein directing the stream of material from the PVD source toward the surface of the substrate at the fourth non-perpendicular angle to the plane of the surface to selectively deposit the material on the top portion of the one or more features on the substrate and form the fourth overhang extending beyond the second sidewall comprises directing the stream of material from the second PVD source toward the surface of the substrate at the fourth non-perpendicular angle to the plane of the surface to selectively deposit the material on the top portion of the one or more features on the substrate and form the fourth overhang extending beyond the second sidewall.

9. The method of claim 1, wherein the material is at least one of titanium (Ti) nitride (TiN), silicon (Si), silicon nitride (SiN), and silicon oxynitride (SiON).

10. The method of claim 1, wherein a distance that the first overhang extends beyond the first sidewall and a distance that the second overhang extends beyond the second sidewall is varied for forming the pattern, and
wherein a formed pattern comprises at least one of a plurality of vias or trenches.

11. The method of claim 1, wherein the layer of the substrate comprises a first layer, a second layer disposed atop the first layer and having the pattern formed thereon, and a third layer including the one or more features and disposed atop the second layer.

12. The method of claim 11, wherein etching for the first and second times comprises etching through an opening of the one or more features in the third layer and through the second layer to expose the first layer, such that the opening of the one of more features is turned into the first part and the second part of the pattern on the second layer including two openings that are smaller than the opening of the one or more features.

13. A method for processing a substrate, comprising:
directing a stream of material from a PVD source toward a surface of a substrate at a first non-perpendicular angle to a plane of the surface to selectively deposit the material on a top portion of one or more features on the substrate and form a first overhang extending beyond a first sidewall of the one or more features, the substrate comprising a first layer, a second layer disposed atop the first layer, and a third layer including the one or more features disposed atop the second layer;
etching for a first time the second layer of the substrate disposed beneath the one or more features selective to the deposited material to form a first part of a pattern on the second layer;
removing the deposited material from the one or more features;
directing the stream of material from the PVD source toward the surface of the substrate at a second non-perpendicular angle to the plane of the surface to selectively deposit the material on the top portion of the one or more features on the substrate and form a second overhang extending beyond a second sidewall, opposite the first sidewall of the one or more features; and
etching for a second time the second layer of the substrate beneath the one or more features selective to the deposited material to form a second part of the pattern on the second layer,
wherein directing the stream of material from the PVD source toward the surface of the substrate at the second non-perpendicular angle to the plane of the surface to selectively deposit the material on the top portion of the one or more features on the substrate and form the second overhang extending beyond the second sidewall comprises rotating the substrate and directing the stream of material from the PVD source toward the surface of the substrate at the second non-perpendicular angle to the plane of the surface to selectively deposit the material on the top portion of the one or more features on the substrate and form the second overhang extending beyond the second sidewall, and
wherein the substrate is rotated 180°.

14. The method of claim 13, wherein the first non-perpendicular angle and the second non-perpendicular angle are different from each other such that a distance that the first overhang extends beyond the first sidewall is at least one of greater than or less than a distance that the second overhang extends beyond the second sidewall.

15. The method of claim 13, further comprising:
after etching for the second time, removing the deposited material from the one or more features;
directing the stream of material from the PVD source toward the surface of the substrate at a third non-perpendicular angle to the plane of the surface to selectively deposit the material on the top portion of the one or more features on the substrate and form a third overhang extending beyond the first sidewall;
directing the stream of material from the PVD source toward the surface of the substrate at a fourth non-perpendicular angle to the plane of the surface to selectively deposit the material on the top portion of the one or more features on the substrate and form a fourth overhang extending beyond the second sidewall;
etching for a third time the second layer of the substrate beneath the one or more features selective to the deposited material to form a third part of the pattern on the second layer; and
removing the one or more features from the substrate.

16. The method of claim 15, wherein directing the stream of material from the PVD source toward the surface of the substrate at the fourth non-perpendicular angle to the plane of the surface to selectively deposit the material on the top portion of the one or more features on the substrate and form the fourth overhang extending beyond the second sidewall comprises rotating the substrate and directing the stream of material from the PVD source toward the surface of the substrate at the fourth non-perpendicular angle to the plane of the surface to selectively deposit the material on the top portion of the one or more features on the substrate and form the fourth overhang extending beyond the second sidewall, and
wherein the substrate is rotated 180°.

17. The method of claim 15, wherein the PVD source comprises a second PVD source, and
wherein directing the stream of material from the PVD source toward the surface of the substrate at the fourth non-perpendicular angle to the plane of the surface to selectively deposit the material on the top portion of the one or more features on the substrate and form the fourth overhang extending beyond the second sidewall comprises directing the stream of material from the second PVD source toward the surface of the substrate at the fourth non-perpendicular angle to the plane of the surface to selectively deposit the material on the top portion of the one or more features on the substrate and form the fourth overhang extending beyond the second sidewall.

18. A nontransitory computer readable storage medium having stored thereon a plurality of instructions that when executed cause a process controller to perform a method for processing a substrate, the method comprising:
directing a stream of material from a PVD source toward a surface of a substrate at a first non-perpendicular angle to a plane of the surface to selectively deposit the material on a top portion of one or more features on the substrate and form a first overhang extending beyond a first sidewall of the one or more features;

etching for a first time a layer of the substrate disposed beneath the one or more features selective to the deposited material to form a first part of a pattern on the layer;

removing the deposited material from the one or more features;

directing the stream of material from the PVD source toward the surface of the substrate at a second non-perpendicular angle to the plane of the surface to selectively deposit the material on the top portion of the one or more features on the substrate and form a second overhang extending beyond a second sidewall, opposite the first sidewall of the one or more features;

etching for a second time the layer of the substrate beneath the one or more features selective to the deposited material to form a second part of the pattern on the layer;

after etching for the second time, removing the deposited material from the one or more features;

directing the stream of material from the PVD source toward the surface of the substrate at a third non-perpendicular angle to the plane of the surface to selectively deposit the material on the top portion of the one or more features on the substrate and form a third overhang extending beyond the first sidewall;

directing the stream of material from the PVD source toward the surface of the substrate at a fourth non-perpendicular angle to the plane of the surface to selectively deposit the material on the top portion of the one or more features on the substrate and form a fourth overhang extending beyond the second sidewall;

etching for a third time the layer of the substrate beneath the one or more features selective to the deposited material to form a third part of the pattern on the layer; and removing the one or more features from the substrate.

* * * * *